(12) United States Patent
Maeda (10) Patent No.: US 7,388,214 B2
(45) Date of Patent: Jun. 17, 2008

(54) CHARGED-PARTICLE BEAM EXPOSURE APPARATUS AND METHOD

(75) Inventor: Takashi Maeda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 209 days.

(21) Appl. No.: 11/315,303

(22) Filed: Dec. 23, 2005

(65) Prior Publication Data

US 2006/0138359 A1 Jun. 29, 2006

(30) Foreign Application Priority Data

Dec. 28, 2004 (JP) ............................. 2004-378665

(51) Int. Cl.
G21K 5/04 (2006.01)
(52) U.S. Cl. ........................... 250/492.22; 250/492.23; 250/492.2; 250/492.1
(58) Field of Classification Search ........... 250/492.22, 250/492.23, 492.2, 492.1, 396 R
See application file for complete search history.

(56) References Cited

U.S. PATENT DOCUMENTS

| 6,541,785 B1 * | 4/2003 | Nakasuji | 250/493.1 |
| 6,969,862 B2 | 11/2005 | Muraki et al. | 250/492.22 |
| 2004/0135102 A1 * | 7/2004 | Muraki et al. | 250/492.22 |

FOREIGN PATENT DOCUMENTS

| JP | 2003-51437 | 2/2003 |
| JP | 2004-193516 | 7/2004 |

* cited by examiner

*Primary Examiner*—Jack I. Berman
*Assistant Examiner*—Michael Maskell
(74) *Attorney, Agent, or Firm*—Fitzpatrick, Cella, Harper & Scinto

(57) ABSTRACT

A charged particle beam exposure apparatus which splits a charged-particle beam from a charged-particle beam source into a plurality of charged-particle beams by a plurality of apertures formed in an aperture array to expose a wafer using the plurality of charged-particle beams. The apparatus includes a stage on which the wafer is loaded, the wafer being irradiated with the plurality of charged-particle beams, which have been passed through the apertures of the aperture array, a plurality of detection electrodes which detect intensities of the plurality of charged-particle beams passing through the plurality of apertures of the aperture array to expose the wafer with the plurality of charged-particle beams, the plurality of detection electrodes being formed on the charged-particle beam source side of the light-shielding peripheral regions of the plurality of apertures of the aperture array, and a grid array which adjusts the intensities of the plurality of charged-particle beams on the basis of detection results obtained by the plurality of detection electrodes.

5 Claims, 9 Drawing Sheets

CHARGED-PARTICLE BEAM EXPOSURE APPARATUS AND METHOD

This application claims the benefit of Japanese Patent Application No. 2004-378665 filed on Dec. 28, 2004, which is hereby incorporated by reference herein in its entirety.

FIELD OF THE INVENTION

The present invention relates to a charged-particle beam exposure apparatus and method.

BACKGROUND OF THE INVENTION

Recently, as a measure for implementing highly integrated and micropatterned semiconductor devices, an exposure apparatus using a charged-particle beam, such as an electron beam has been developed. The exposure apparatus has been considered to be unfit for mass-production until now, because of a low throughput.

However, the exposure apparatus is becoming a way to attain a practical throughput for mass-production by recent developments in a stencil mask type electron beam exposure apparatus and a multi-electron-beam exposure apparatus. Since these exposure apparatuses have a wider area to be exposed at once, i.e., an exposure area wider than that adopted in the prior art, throughput can be increased.

Unfortunately, in the stencil mask type charged-particle beam exposure apparatus, if the intensities of charged-particle beams, which strike the stencil mask are nonuniform in the irradiation region, the pattern to be transferred will deform. Furthermore, in the charged-particle beam exposure apparatus, a variation in intensities of a plurality of charged-particle beams will distort the pattern to be drawn. In particular, if a variation in intensities of charged-particle beams occurs due to a change in intensity distribution of the charged-particle beams during exposure, the drawing accuracy of the exposure apparatus greatly decreases.

To uniformly irradiate a wide range with beams by using the charged-particle exposure apparatus, a charged-particle beam source and optical system have been improved until now. However, irradiation uniformity achieved by such improvements is insufficient.

The irradiation intensity of a charged-particle beam irradiated from a charged-particle beam source often varies not only due to static intensity nonuniformity, but also due to the charged-particle beam source itself and an external environmental factor. The variation in irradiation intensity causes nonuniformity in the intensity distribution of charged-particle beams in the irradiation region, which is unpredictable by the charged-particle beam exposure apparatus, resulting in degradation in drawing accuracy.

In some cases, uniformity of the irradiation intensities of charged-particle beams is lost by replacing a charged-particle beam source or maintaining a certain structure associated with the beams.

Accordingly, a technique has been demanded to obtain statistically sufficient uniformity of the irradiation intensities, and to detect and to correct the irradiation intensity distribution of charged-particle beams during actual exposure in real time.

To meet this demand, as the technique for correcting a variation in intensities of charged particle beams in a charged-particle beam exposure apparatus, a method is proposed, which mounts apertures for irradiation current detection on an aperture array to detect the irradiation intensity distribution in real time (Japanese Patent Laid-Open No. 2004-193516). In addition, a method is proposed which manages the exposure time by controlling the blanker ON/OFF time (Japanese Patent Laid-Open No. 2003-051437). In the method of managing the exposure time by controlling the blanker ON/OFF time, to improve throughput, a blanker must be turned on/off under the control of the apparatus at a very high speed. However, the increase in throughput is limited due to difficulty in strict time management.

SUMMARY OF THE INVENTION

The present invention has been made in consideration of the above situation, and has as its object to provide a multibeam charged-particle beam exposure apparatus capable of making the intensity distribution of charged-particle beams irradiated in exposure uniform and drawing a pattern with high accuracy, and a multibeam charged-particle beam exposure method.

According to the present invention, there is provided a charged-particle beam exposure apparatus, which splits a charged-particle beam from a charged-particle beam source into a plurality of charged-particle beams by a plurality of apertures formed in an aperture array to execute exposure using the plurality of charged-particle beams, comprising a detection unit which detects an intensity of the charged-particle beam passing through the aperture of the aperture array, and a grid array which adjusts an intensity of the charged-particle beam on the basis of the detection result obtained by the detection unit.

According to the present invention, there is provided a charged-particle beam exposure method, by a charged-particle beam exposure apparatus, which splits a charged-particle beam from a charged-particle beam source into a plurality of charged-particle beams by a plurality of apertures formed in an aperture array to execute exposure using the plurality of charged-particle beams, comprising steps of detecting an intensity of the charged-particle beam passing through the aperture of the aperture array, and adjusting an intensity of the charged-particle beam on the basis of the detection result obtained in the detection step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 2A to 2D are views showing details of an aperture array and an irradiation current detector of the multi-electron-beam exposure apparatus shown in FIG. 1, in which

FIGS. 3A to 3C are views showing details of a grid array of the multi-electron-beam exposure apparatus in FIG. 1, in which

DETAILED DESCRIPTION OF THE PREFERRED EMBODIMENTS

Embodiments of a multi-electron-beam exposure apparatus to which the present invention is applied will be described below in detail as preferred embodiments of a charged particle beam exposure apparatus according to the present invention. The present invention is not limited to an exposure apparatus using an electron beam, and can be applied to an exposure apparatus using other charged-particle beams, such as an ion beam.

First Embodiment

Figure 1:
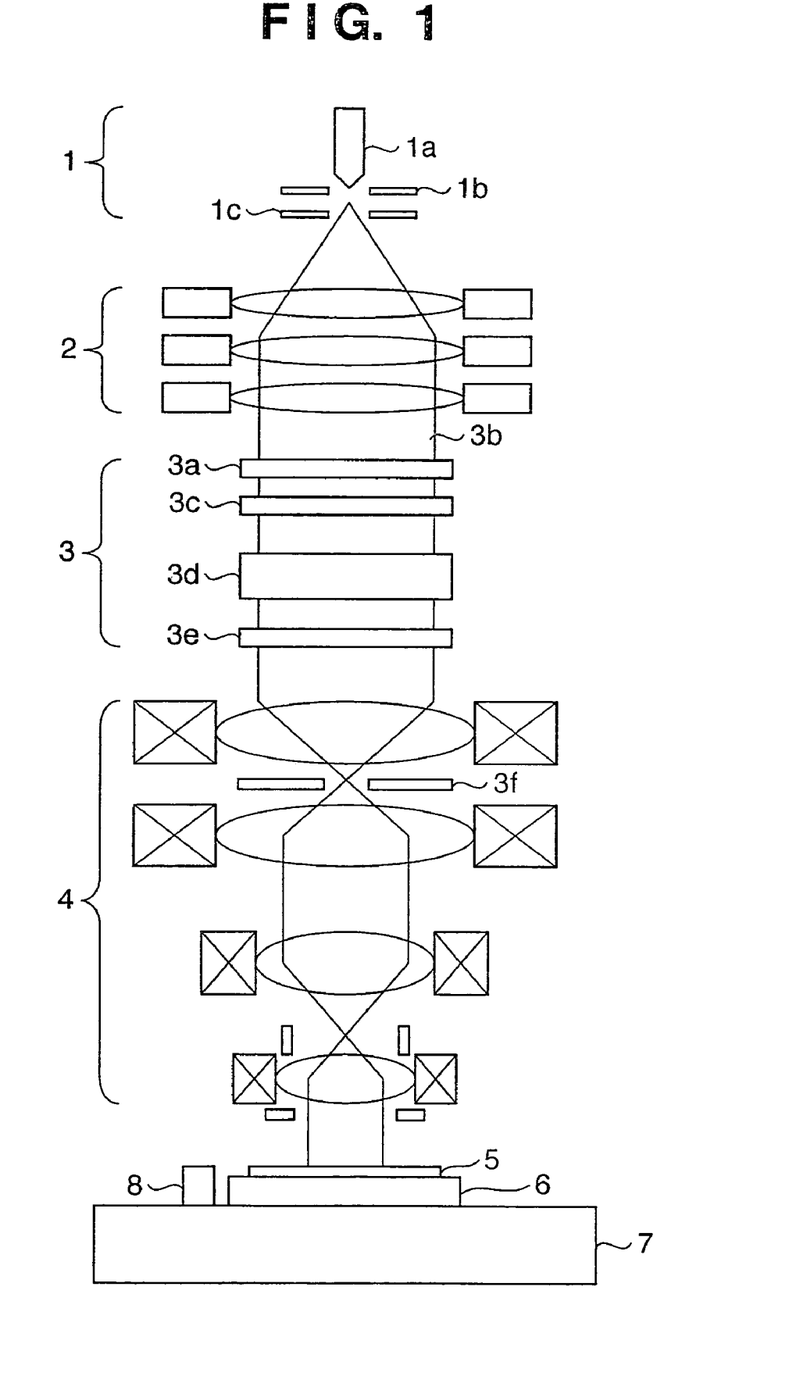
FIG. 1 is an elevation view schematically showing the main part of a multi-electron-beam exposure apparatus according to the first embodiment of the present invention.

FIG. 1 is an elevation view schematically showing the main part of the multi-electron-beam exposure apparatus according to the present invention. An electron gun 1 includes a cathode 1a, a grid 1b, and an anode 1c. Electrons emitted by the cathode 1a form a crossover image between the grid 1b and anode 1c. The crossover image will be referred to as an electron source hereinafter.

An electron beam emitted by the electron source is collimated into an almost parallel electron beam by a collimator lens 2 including a plurality of electrostatic electron lenses. A correction electron optical system 3 is irradiated with the almost parallel electron beam.

The correction electron optical system 3 comprises an aperture array 3a, a grid array 3c, an element electron optical system 3d, a blanker array 3e, and a stopper array 3f, which are arranged in turn from the electron gun 1 side along the optical axis. The aperture array 3a includes an irradiation current detector 3b.

Figure 2A:
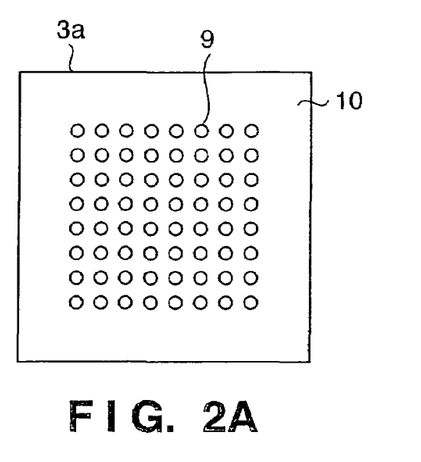
FIG. 2A is a plan view showing the entire aperture array.
Figure 2B:
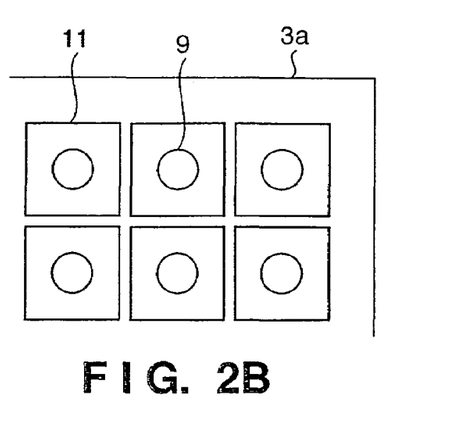
FIG. 2B is a partial plan view.
Figure 2C:
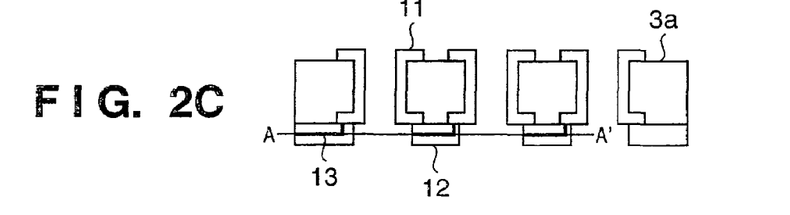
FIG. 2C is a partial sectional view.
Figure 2D:
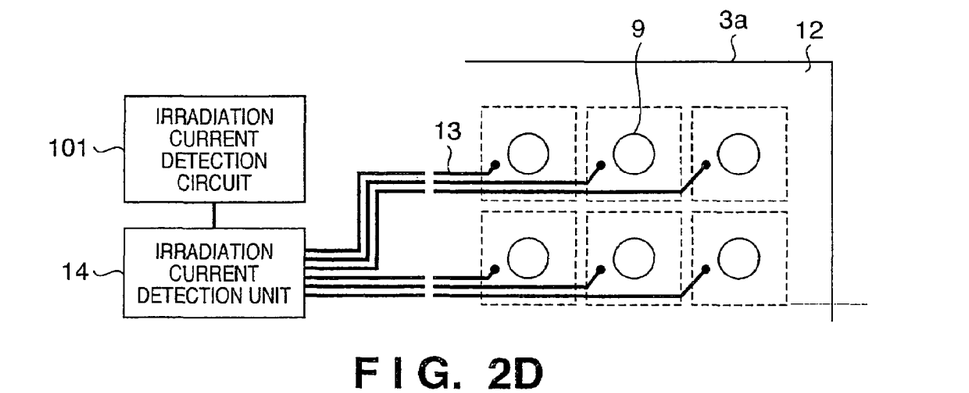
FIG. 2D is a sectional view taken along the line A-A' in FIG. 2C.

FIGS. 2A to 2D show details of the aperture array 3a. FIG. 2A shows the entire aperture array 3a. FIGS. 2B, 2C, and 2D show details of apertures 9 and the irradiation current detector 3b. As shown in FIG. 2A, the aperture array 3a includes the plurality of apertures 9 and a light-shielding portion 10 as the remaining portion. The irradiation current detector 3b includes electrode pads (detection electrodes) 11 (see FIGS. 2B and 2C), which focus an irradiation electron beam formed on the surface of the light-shielding portion 10 around each aperture 9 of the aperture array 3a, and a current detection unit 14 (see FIG. 2D), which detects an irradiation current. The electrode pads 11 are independently prepared for the apertures 9. As shown in FIG. 2C, the electrode pads 11 are extracted outside the aperture array 3a by wiring lines 13 formed on a wiring substrate 12. The wiring lines 13 extracted outside are connected to a current detection unit 14. The output of the current detection unit 14 is connected to an irradiation current detection circuit 101. Each aperture of the wiring substrate 12 and the aperture 9 may be concentric and have the same diameter as long as an electron beam, which has passed through the aperture 9, is not shielded. The wiring lines of the wiring substrate 12 run through portions aside from the apertures.

Figure 8A:
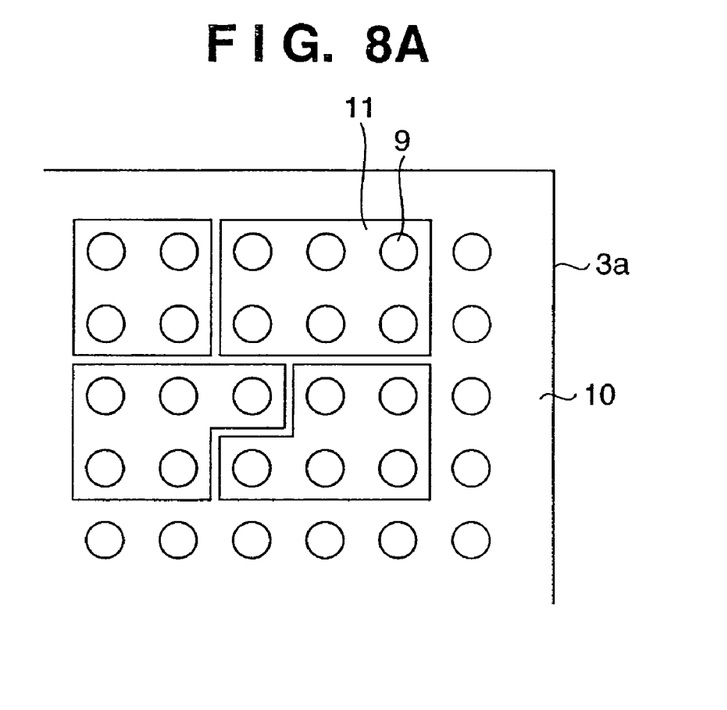
FIGS. 8A and 8B are plan views showing an example of the irradiation current detector and grid array, respectively, of the multi-electron-beam exposure apparatus in FIG. 1.

As shown in FIG. 8A, the electrode pad 11 may be commonly used to surround the plurality of apertures 9.

Figure 3A:
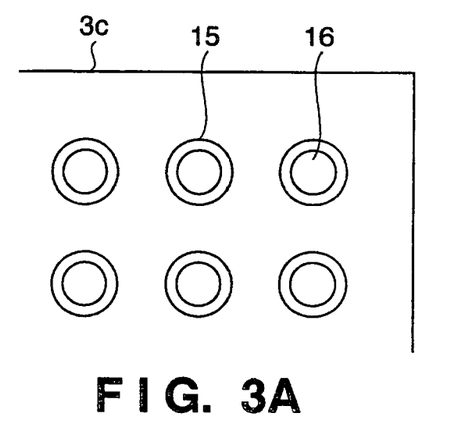
FIG. 3A is a partial plan view.
Figure 3B:
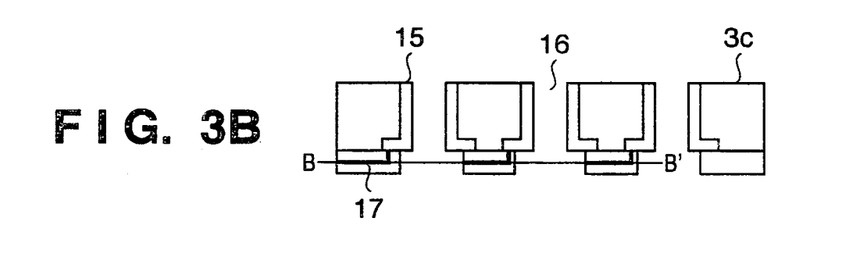
FIG. 3B is a partial sectional view.
Figure 3C:
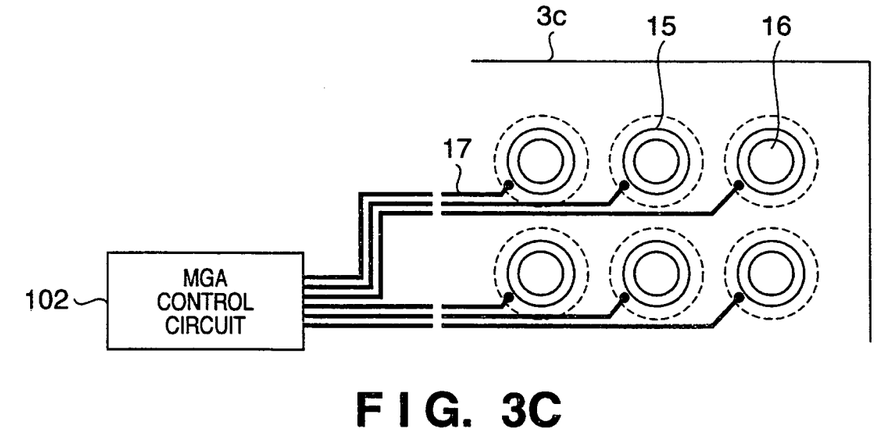
FIG. 3C is a sectional view taken along the line B-B' in FIG. 3B.

FIGS. 3A to 3C show details of the grid array 3c. The grid array 3c has apertures 16, which correspond to respective electron beams split by the aperture array 3a (arrayed coaxially with the respective apertures 9 of the aperture array 3a). Each aperture 16 has a grid electrode (adjusting electrode) 15. A cylindrical electrode can be used as the grid electrode 15. Wiring lines 17 are connected to the grid electrodes 15 to be able to individually apply voltages to them. The wiring lines 17 are connected to the output of an MGA control circuit 102 (see FIG. 3C), which can individually set voltages to be applied to the grid electrodes 15.

Figure 8B:
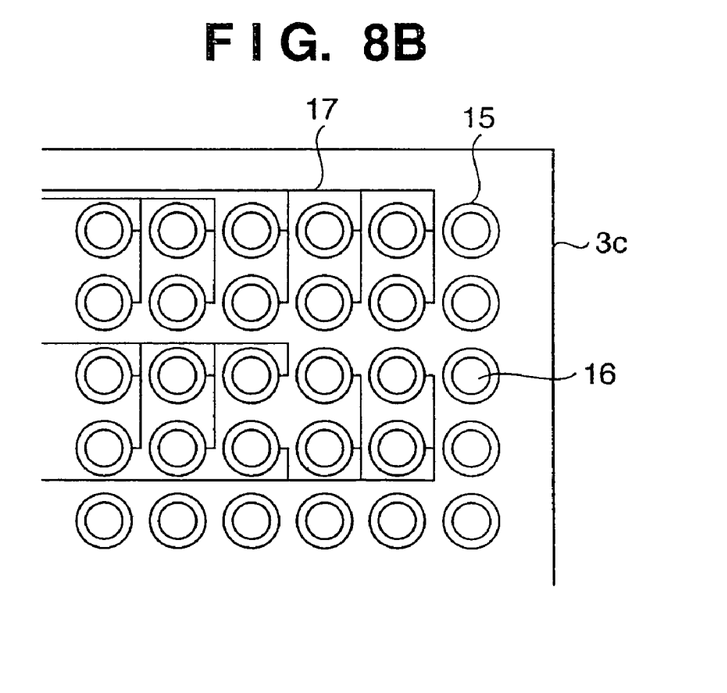

As shown in FIG. 8B, preferably, the wiring line 17 may be commonly connected to the plurality of grid electrodes 15.

Referring back to FIG. 1, a plurality of electron beams, which have passed through the grid array 3c, form a plurality of intermediate images of the electron source by the element electron optical system 3d. The blanker array 3e, having a plurality of blankers, is arranged on the intermediate image plane.

A reduction electron optical system 4, including two-stage symmetrical magnetic doublet lenses, is arranged downstream of the intermediate images. The plurality of intermediate images are projected onto a wafer 5 to be exposed. At this time, an electron beam deflected by the blanker array 3e is shielded by the stopper array 3f, and is not applied to the wafer 5. On the other hand, an electron beam, which is not deflected by the blanker array 3e, is not shielded by the stopper array 3f, and is applied the wafer 5. The irradiation current amount can also be controlled by adjusting the deflection ON/OFF time of the blanker array 3e.

The reduction electron optical system 4 includes a deflector (not shown), which deflects the plurality of electron beams from the element electron optical system 3d to displace a plurality of light source images on the wafer 5 in the X and Y directions by almost the same displacement amount. The deflector includes a main deflector, which is used for an electron beam at a large deflection width, and a sub-deflector, which is used for an electron beam at a small deflection width.

The reduction electron optical system 4 includes a dynamic focus coil, which corrects a shift in the focus position of an electron source image caused by deflection aberration generated in activating the deflector, and a dynamic stigmatic coil which corrects astigmatism of deflection aberration generated by deflection.

A θ-Z stage 6 mounts the wafer 5 and is movable in the optical axis (Z-axis) direction and the rotational direction around the Z-axis. A stage reference plate is fixed to the θ-Z stage 6. An X-Y stage 7 mounts the θ-Z stage 6 and is movable in the X and Y directions perpendicular to the optical axis (Z-axis). A Faraday cup 8 detects the current amount of an electron beam applied to the stage surface.

If the correction method of the present invention is not applied to the plurality of electron beams, which pass through the correction electron optical system 3, their current densities become nonuniform, resulting in poor drawing accuracy.

The constituent elements of the correction electron optical system used for the multi-electron-beam exposure apparatus according to this embodiment will be described below with reference to the accompanying drawings. As described above, the correction electron optical system 3 comprises the aperture array 3a, the grid array 3c, the element electron optical system 3d, the blanker array 3e, and the stopper array 3f. The aperture array 3a includes the irradiation current detector 3b.

Figure 4:
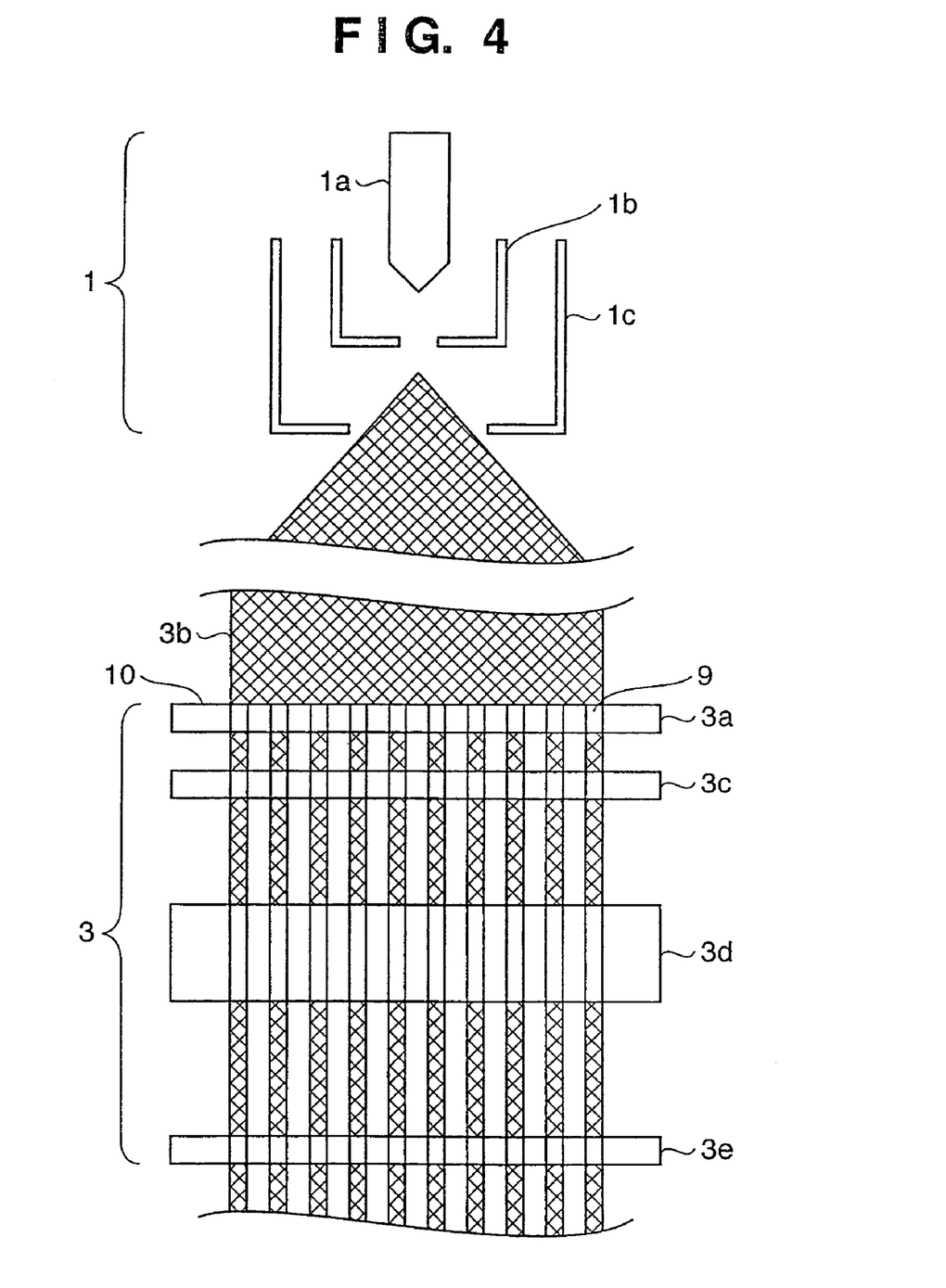
FIG. 4 is a sectional view showing details of a correction electron optical system of the multi-electron-beam exposure apparatus in FIG. 1.

The electron gun 1 outputs an electron beam by setting the irradiation current amount to a certain value. However, the intensity distribution of the output electron beams is non-uniform in the irradiated surface. The electron beams reach the aperture array 3a to have a specific plane distribution due to, e.g., the installation states of the electron gun 1 and the exposure apparatus. As shown in FIG. 4, the plurality of apertures 9 are formed in the substrate of the aperture array 3a. The group of the electron beams, which have reached the aperture array 3a, pass through the apertures 9 while being split into a plurality of electron beams. The individual electron beams have different irradiation intensities, i.e., irradiation current densities in accordance with the irradiation intensity distribution of the electron beams.

The operation of the irradiation current detector 3b shown in FIG. 2 will be described below. The irradiation current detector 3b, which detects an irradiation current supplied from each electron beam, includes the electrode pads 11 formed on the light-shielding portion 10 around each aperture 9 of the aperture array 3a, and the irradiation current detection unit 14 for detecting the current amount of an electron beam, which is applied to the electrode pad 11. The current density of an electron beam applied to the electrode pad 11 may be almost equal to that of an electron beam, which passes through the aperture 9. Hence, when the amount of a current, which is supplied to the electrode pad 11 formed on the surface of the light-shielding portion 10 around each aperture 9 of the aperture array 3a, is measured by the irradiation current detection unit 14, the current density of an electron beam, which passes through each aperture 9 of the aperture array 3a, can be determined.

According to this embodiment, an electron beam applied to the light-shielding portion 10 of the aperture array 3a is used in detecting the irradiation current density. Hence, an electron beam, which is to be exposed to the wafer, is not shielded in detecting the irradiation current density. This makes it possible to detect the irradiation current density of each electron beam during an actual exposure operation.

In addition, if the electrode pad 11 is commonly provided for the plurality of apertures 9, an irradiation area per electrode pad increases. This increases the accuracy of irradiation current detection (FIG. 8). Note that the current density calculated in this way is the average of the current densities of the plurality of apertures 9.

Current density correction operation of the grid array 3c will be described with reference to FIG. 3. The grid array 3c has the apertures 16, which are arrayed coaxially with the corresponding optical axes of a plurality of electron beams in correspondence with the respective apertures 9 of the aperture array 3a. Each aperture 16 of the grid array 3c has the grid electrode 15. When a voltage having the same polarity as that of the anode of the electron gun 1 is applied to the grid electrode 15, part of an electron beam, which passes through the aperture 16, is drawn into the grid electrode 15. At this time, the irradiation current amount of the electron gun 1 is not changed by applying the voltage to the grid electrode 15, because the voltage applied to the grid electrode 15 has almost no influence on the electron gun 1. Hence, the irradiation current density of the electron beam, which has passed through the grid electrode 15, is lower than that before passage by the amount of an irradiation current drawn into the grid electrode 15.

If the value of a voltage to be applied to the grid electrode 15 is set to be higher than a certain reference value, the drawn current amount increases (the amount of a flowing current is less than the reference value). If the value of a voltage to be applied to the grid electrode 15 is set to be lower than the reference value, the drawn current amount decreases (the amount of a flowing current is larger than the reference value). Accordingly, the irradiation current density of an electron beam can be adjusted by the value of a voltage to be applied to the grid electrode 15. When the MGA control circuit 102 individually and appropriately applies a voltage to each grid electrode 15, the irradiation current density distribution can be corrected to be uniform in the irradiated surface.

As shown in FIG. 8B, when the wiring line 17 is commonly connected to the plurality of grid electrodes 15, if a large number of the apertures 16 are formed, it is possible to save the space of connection wiring lines and to simplify a control circuit. Note that the MGA control circuit 102 applies a common voltage to the grid electrodes 15 corresponding to a commonly connected area. That is, the position resolution in irradiation current density correction lowers. As a countermeasure against this problem, an area can be divided in accordance with the current density distribution of electron beams, such that a portion where a density change is large is finely divided, and a portion where a density change is small is roughly divided.

Referring to FIG. 4, one element electron optical system 3d is built by electron lenses of first and second electron optical system lens arrays, which are arrayed along axes extending in the common optical axis direction. Since the aperture array 3a is located near the front focal position of the element electron optical system 3d, the element electron optical system 3d forms intermediate images of the electron source near the rear focal positions of the element electron optical system 3d by using a plurality of split electron beams.

Figure 5:
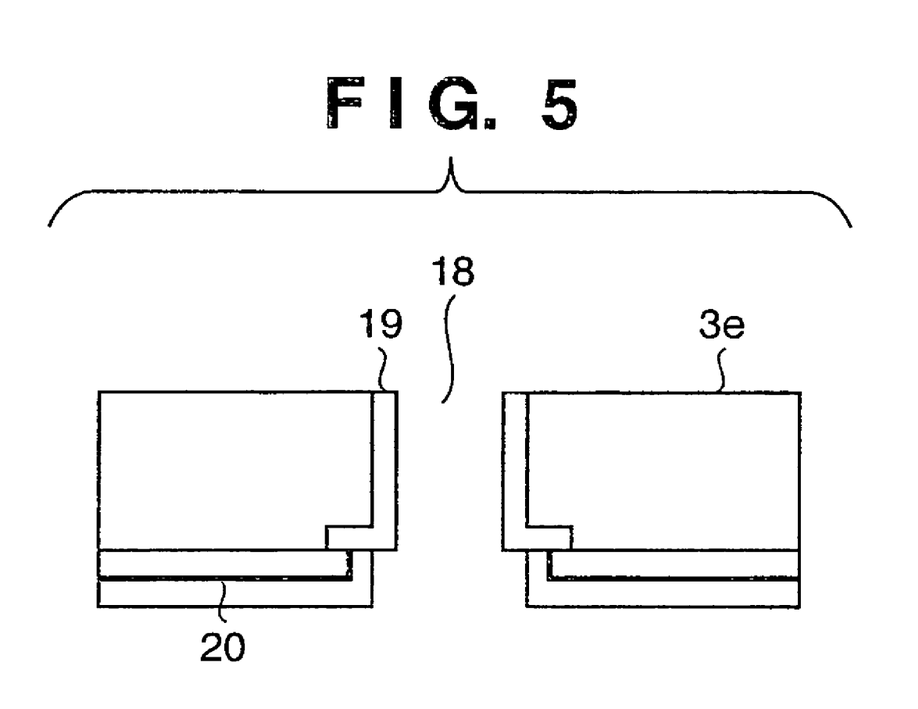
FIG. 5 is a partial sectional view showing details of a blanker array of the multi-electron-beam exposure apparatus in FIG. 1.

The blanker array 3e has a substrate on which a plurality of deflecting portions are formed to individually deflect a plurality of electron beams split by the aperture array 3a. Details of one of the deflecting portions are shown in FIG. 5. The substrate is formed to have apertures 18 and pairs of electrodes across the corresponding apertures 18, each of which has a blanking electrode 19 with a deflection function. Wiring lines 20 are formed on the substrate to individually turn on/off the blanking electrodes 19.

A plurality of apertures are formed in the substrate of the stopper array 3f shown in FIG. 1, similar to the aperture array 3a. An electron beam deflected by the blanker array 3e moves outside the corresponding aperture of the stopper array 3f, and does not pass through the stopper array 3f.

Figure 6:
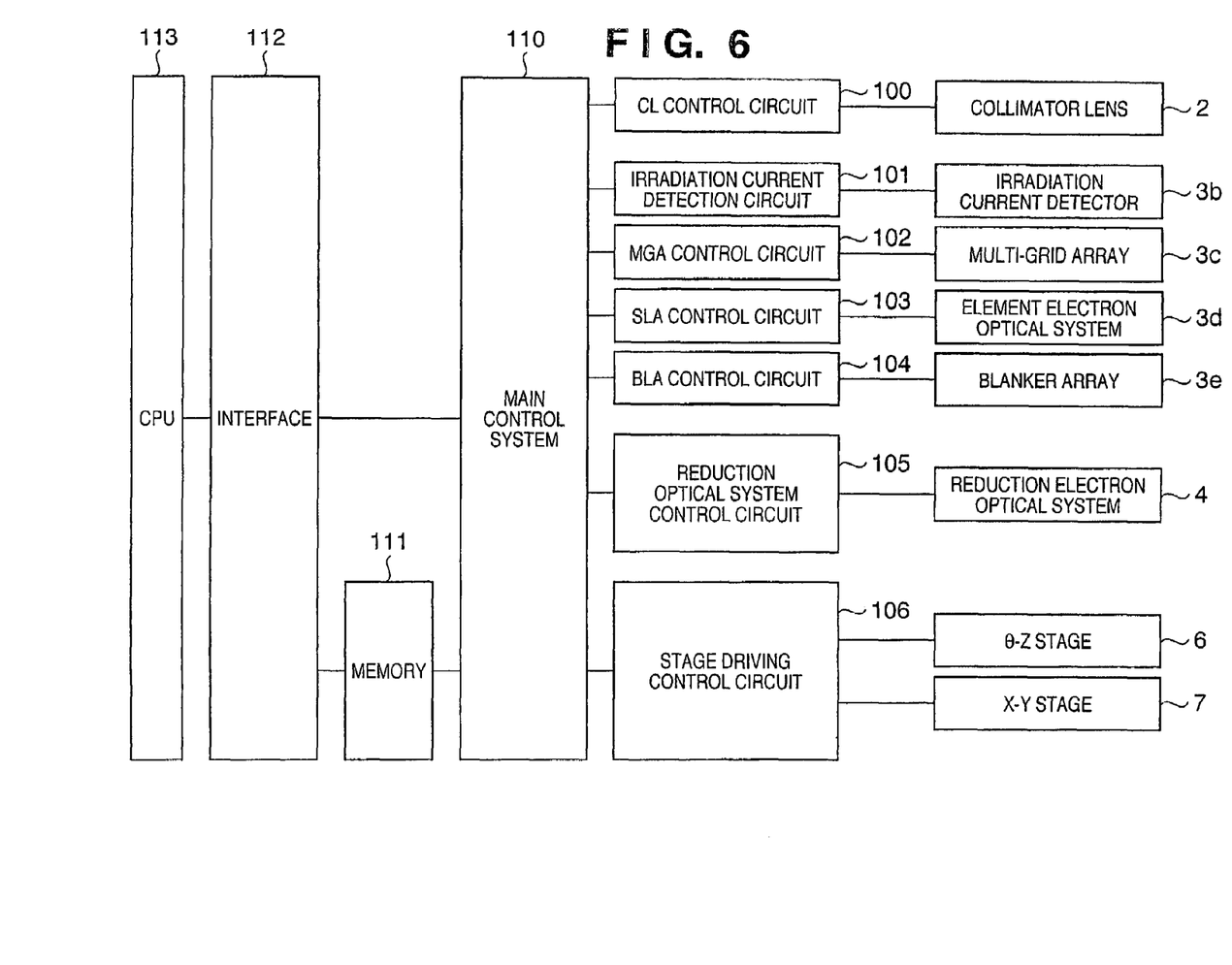
FIG. 6 is a block diagram for explaining the system arrangement of the multi-electron-beam exposure apparatus according to the first embodiment of the present invention.

FIG. 6 is a block diagram showing the system arrangement of this embodiment. A CL control circuit 100 serves as a control circuit, which controls the focal lengths of the collimator lens 2. A BLA control circuit 104 serves as a control circuit, which individually controls the ON/OFF time of the blanking electrodes 19 of the blanker array 3e. An SLA control circuit 103 serves as a control circuit, which controls the focal lengths of the electron lenses of the element electron optical system 3d.

The irradiation current detection circuit 101 serves as a circuit, which calculates the irradiation current amount by a signal from the irradiation current detector 3b. The MGA control circuit 102 serves as a control circuit, which controls the grid array 3c and individually controls the irradiation current densities of electron beams. A reduction electron optical system control circuit 105 serves as a control circuit, which controls the reduction optical system 4. A stage driving control circuit 106 serves as a control circuit, which controls driving of the θ-Z stage 6 and X-Y stage 7.

A main control system 110 controls the plurality of control circuits on the basis of data from a memory 111, which stores a drawing pattern. A CPU 1113, which controls the overall electron beam exposure apparatus via an interface 112, controls the main control system 110.

An irradiation current amount control operation, using the irradiation current detector 3b and grid array 3c in the above system arrangement, will be described below.

The main control system 110 executes an appropriate arithmetic operation by using, as an input, the irradiation current amount of each electron beam calculated by the irradiation current detection circuit 101, such that the irradiation current amounts of the electron beams become uniform. The main control system 110 outputs the value of a voltage to be applied to each grid electrode 15 to the MGA control circuit 102. The MGA control circuit 102 applies the voltage to each grid electrode 15 of the grid array 3c in accordance with the applied voltage value output from the main control system 110. As a result, the irradiation current densities of electron beams irradiated from the apertures 16 are corrected to be uniform.

The irradiation current detector 3b can detect the irradiation current density without inhibiting an exposure electron beam from being applied to a wafer during an actual exposure operation. Hence, the irradiation current density can be corrected during an actual exposure operation.

Figure 7:
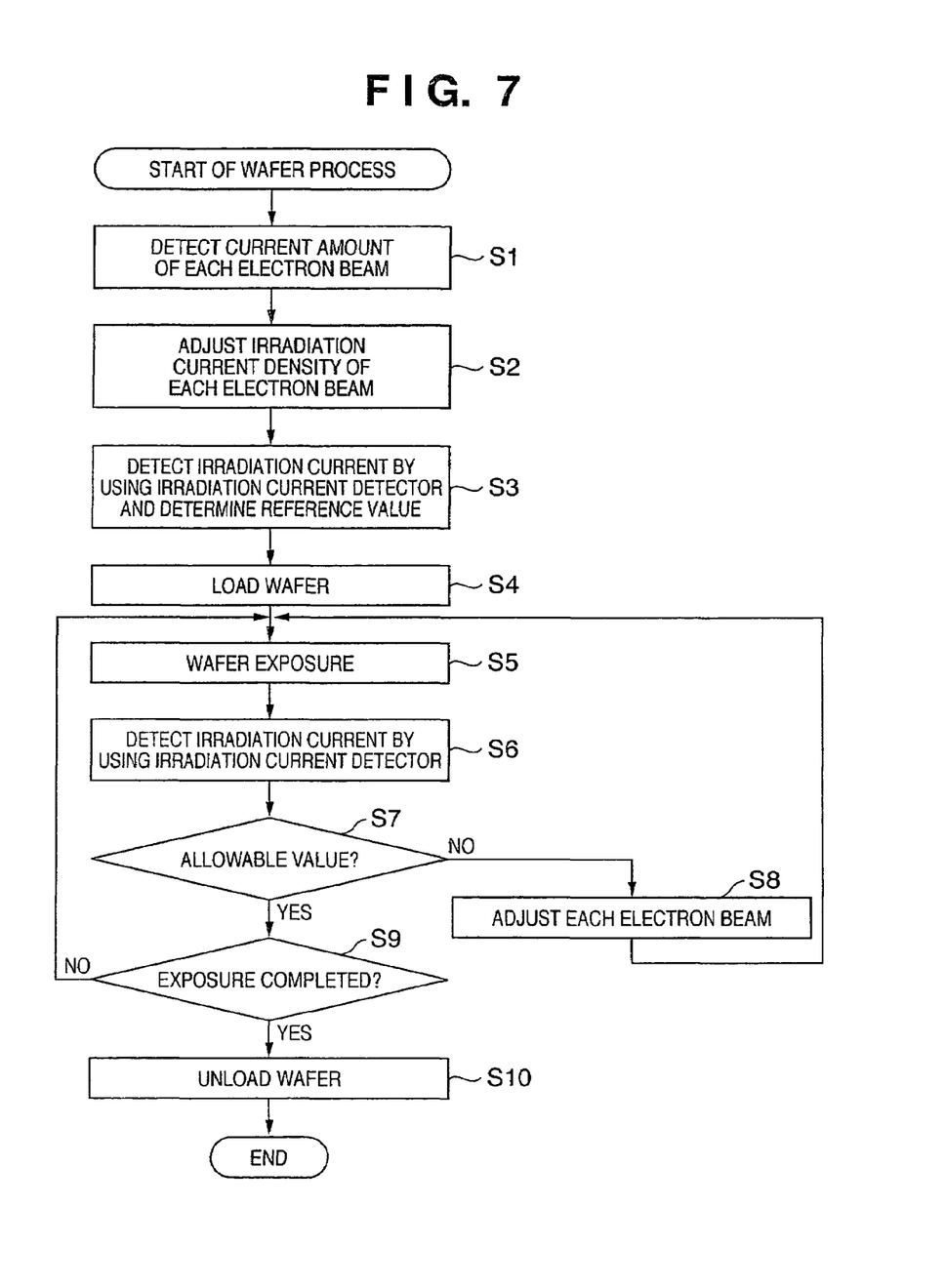
FIG. 7 is a flowchart for explaining an exposure process executed by the multi-electron-beam exposure apparatus according to the first embodiment of the present invention.

The operation of the electron beam exposure apparatus according to this embodiment will be described below with reference to FIG. 7. The main control system 110 executes the processing steps shown in FIG. 7 to expose the wafer 5 by using the electron beam exposure apparatus.

In step S1, the main control system 110 selects one electron beam, of a plurality of electron beams to be formed by the aperture array 3a, which is to reach the wafer 5, and controls the BLA control circuit 104 to apply only the selected electron beam to the wafer 5. At this time, the stage driving control circuit 106 drives the X-Y stage 7 to move the Faraday cup 8 close to the selected electron beam, which should reach the wafer 5, thereby detecting the current amount of the selected electron beam. Other electron beams are in turn detected in the same manner. The main control system 110 stores all the irradiation current amounts of a plurality of electron beams formed by the aperture array 3a.

In step S2, the main control system 110 calculates the intensity distribution of electron beams, which are actually applied to the aperture array 3a on the basis of the irradiation current amounts of all the electron beams stored in step S1. The control system 110 adjusts the grid array 3c on the basis of the obtained intensity distribution so as to make the irradiation current densities of a plurality of split electron beams uniform. That is, the main control system 110 commands the MGA control circuit 102 to adjust the values of voltages to be applied to the grid array 3c.

In step S3, the main control system 110 determines, as a reference value, an irradiation current detection result, after adjustment in step S2, obtained by the irradiation current detector 3b, and stores the reference value. That is, the main control system 110 commands the irradiation current detection circuit 101 to store, as a reference value, the detection result obtained by the irradiation current detector 3b.

In step S4, the wafer 5 is loaded on the θ-Z stage 6.

In step S5, the main control system 110 exposes the wafer 5. The main control system 110 commands the reduction electron optical system control circuit 105 to collectively deflect a plurality of electron beams by using the main deflector. Simultaneously, the main control system 110 commands the BLA control circuit 104 to turn on/off the electron beams in accordance with an exposure pattern to expose the wafer 5. At this time, the X-Y stage 7 continuously moves.

In step S6, during the exposure process, the main control system 110 commands the irradiation current detection circuit 101 to detect irradiation currents by using the irradiation current detector 3b.

In step S7, the main control system 110 calculates the difference between the current value obtained by using the irradiation current detector 3b in step S6 and the reference value set in step S3, and compares the resultant difference with an allowable value. If the difference is larger than the allowable value, it is determined that the irradiation current density distribution of electron beams has nonuniformity as the distribution falls outside an allowable range. Then, the process advances to step S8 to readjust the irradiation current density distribution of the electron beams to be uniform. If the difference falls within the allowable value, the process advances to step S9 to continue the exposure process.

In step S8, the main control system 110 stops the exposure process to adjust the grid array 3c such that an irradiation current of an electron beam detected by the irradiation current detector 3b becomes the reference value. That is, the main control system 110 commands the MGA control circuit 102 to adjust the values of voltages to be applied to the grid array 3c. When the grid array 3c is adjusted such that the measurement result obtained by the irradiation current detector 3b becomes the reference value, the irradiation current density distribution of electron beams actually applied to the aperture array 3a becomes uniform, as in the preceding state (as with the distribution after adjustment in step S2). Note that the exposure process is stopped to prevent an electron beam from reaching the wafer 5 by deflecting all of a plurality of electron beams by using the blanker array 3e.

In step S9, it is determined whether the entire surface of the wafer 5 is completely exposed. If it is determined that exposure is not completed, the flow returns to step S5. If it is determined that exposure is completed, the flow advances to step S10.

In step S10, the wafer 5 is unloaded from the θ-Z stage 6, and the process ends. In this embodiment, the grid array 3c is adjusted such that an irradiation current of an electron beam becomes a reference value. However, the irradiation time of each electron beam may be adjusted by controlling the ON/OFF time of the blanker array 3e to make the integration value of currents applied to the wafer 5 fall within an allowable value. Alternatively, the grid array 3c and blanker array 3e may be used at the same time.

As described above, the irradiation current detector 3b detects the current amounts of electron beams, of electron beams applied to the aperture array 3a, which are drawn into a portion (light-shielding portion 10) and unused for exposure of the wafer 5. This makes it possible to evaluate the irradiation current density distribution of electron beams during exposure. The grid array 3c is then controlled on the basis of the evaluation result to make the irradiation current density distribution of electron beams, which expose the wafer, uniform. In this manner, the irradiation current amounts of a plurality of exposure electron beams can be kept uniform, thus realizing highly accurate exposure.

Second Embodiment

Figure 9:
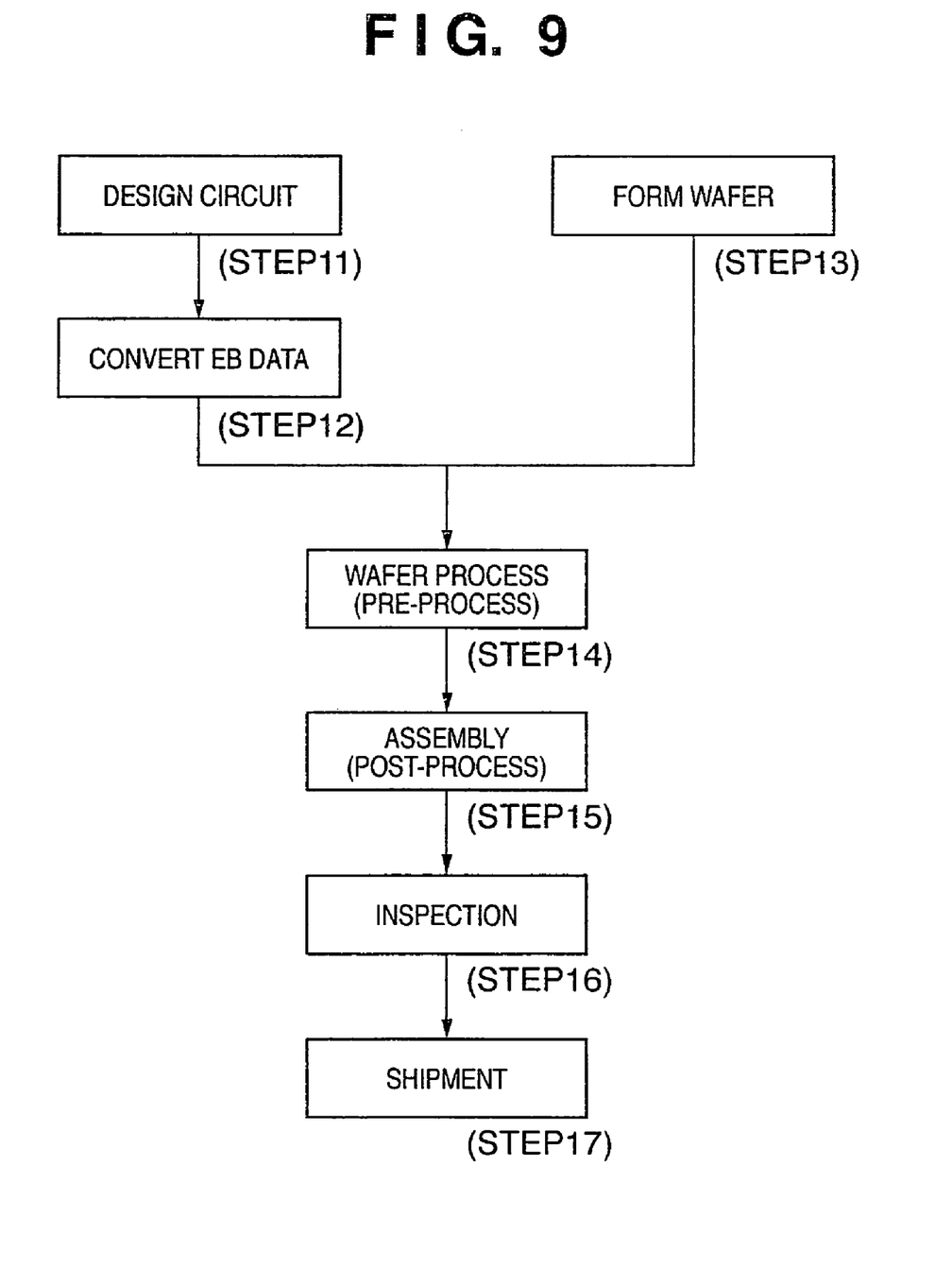
FIG. 9 is a flowchart showing the flow of an overall semiconductor device manufacturing process.

A semiconductor device manufacturing process using the exposure apparatus according to the first embodiment will be described as the second embodiment of the present invention. FIG. 9 is a flowchart showing the flow of the overall semiconductor device manufacturing process. In step 11 (circuit design), a semiconductor device circuit is designed. In step 12 (EB data conversion), exposure control data of the exposure apparatus is created on the basis of the designed circuit pattern.

In step 13 (wafer formation), a wafer is formed using a material such as silicon. In step 14 (wafer process), called a pre-process, an actual circuit is formed on the wafer by lithography using the wafer and the exposure apparatus, which has received the prepared exposure control data. Step 15 (assembly), called a post-process, is the step of forming a semiconductor chip by using the wafer formed in step 14. The post process includes an assembly process (dicing and bonding) and a packaging process (chip encapsulation). In step 16 (inspection), the semiconductor device manufactured in step 15 undergoes inspections, such as an operation confirmation test and a durability test. After these steps, the semiconductor device is completed and shipped in step 17.

The wafer process in step 14 includes an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of causing the above-mentioned exposure apparatus to expose the wafer having undergone the resist processing step to the circuit pattern, a development step of developing the wafer exposed in exposure step, an etching step of etching the resist except for the resist image developed in the development step, and a resist removal step of removing an unnecessary etched resist. These steps are repeated to form multiple circuit patterns on the wafer.

As has been described above, according to the charged-particle beam exposure apparatus and exposure method of the present invention, the intensity distribution of charged-particle beams to be irradiated in exposure can be made uniform, thus realizing highly accurate pattern drawing.

As many apparently widely different embodiments of the present invention can be made without departing from the spirit and scope thereof, it is to be understood that the invention is not limited to the specific embodiments thereof except as defined in the appended claims.

What is claimed is:

1. A charged particle beam exposure apparatus which splits a charged-particle beam from a charged-particle beam source into a plurality of charged-particle beams by a plurality of apertures formed in an aperture array to expose a wafer using the plurality of charged-particle beams, the apparatus comprising:

a stage on which the wafer is loaded, the wafer being irradiated with the plurality of charged-particle beams which have been passed through the apertures of the aperture array;

a plurality of detection electrodes which detect intensities of the plurality of charged-particle beams passing through the plurality of apertures of the aperture array to expose the wafer with the plurality of charged-particle beams, the plurality of detection electrodes being formed on the charged-particle beam source side of the light-shielding peripheral regions of the plurality of apertures of the aperture array; and a grid array which adjusts the intensities of the plurality of charged-particle beams on the basis of detection results obtained by said plurality of detection electrodes.

2. The apparatus according to claim 1, wherein said grid array comprises an aperture corresponding to each aperture formed in the aperture array, and an adjusting electrode to which a voltage individually set for each aperture of said grid array is to be applied, and adjusts an intensity of the charged-particle beam which passes through the aperture of said grid array by giving, to said adjusting electrode, a potential having the same polarity as a polarity of an anode of the charged-particle beam source.

3. The apparatus according to claim 1, wherein said grid array comprises an aperture corresponding to each group of a plurality of apertures formed in the aperture array, and an adjusting electrode to which a voltage individually set for each aperture of the grid array is to be applied, and adjusts an amount of the charged-particle beam which passes through the aperture of said grid array by giving, to said adjusting electrode, a potential having the same polarity as a polarity of an anode of the charged-particle beam source.

4. A charged particle beam exposure method by a charged-particle beam exposure apparatus which splits a charged-particle beam from a charged-particle beam source into a plurality of charged-particle beams by a plurality of apertures formed in an aperture array to expose a wafer using the plurality of charged-particle beams, the method comprising steps of:

detecting, by a plurality of detection electrodes, intensities of the plurality of charged-particle beams passing through the plurality of apertures of the aperture array to expose the wafer with the plurality of charged-particle beams, the plurality of detection electrodes being formed on the charged-particle beam source side of light-shielding peripheral regions of the plurality of apertures of the aperture array; and adjusting intensities of the plurality of charged-particle beams on the basis of detection results obtained in said detecting step.

5. A device manufacturing method comprising steps of:

exposing an exposure target by using a charged-particle beam exposure apparatus defined in claim 1; and developing the exposed exposure target.

* * * * *